United States Patent [19]

Arya

[11] Patent Number: 4,718,947
[45] Date of Patent: Jan. 12, 1988

[54] SUPERLATTICE DOPED LAYERS FOR AMORPHOUS SILICON PHOTOVOLTAIC CELLS

[75] Inventor: Rajeewa R. Arya, Doylestown, Pa.
[73] Assignee: Solarex Corporation, Rockville, Md.
[21] Appl. No.: 853,032
[22] Filed: Apr. 17, 1986
[51] Int. Cl.$^4$ .............................................. H01L 31/06
[52] U.S. Cl. .................................... 136/258; 357/30; 357/59; 437/2; 437/101; 437/110; 148/DIG. 160
[58] Field of Search ................. 136/258 PC, 258 AM, 136/267; 357/2, 16, 30, 59 C, 59 D

[56] References Cited

U.S. PATENT DOCUMENTS

| 4,492,810 | 1/1985 | Ovshinsky et al. | 136/255 |
| 4,500,744 | 2/1985 | Nozaki et al. | 136/258 |
| 4,598,164 | 7/1986 | Tiedje et al. | 136/249 |

OTHER PUBLICATIONS

B. Abeles et al, *Phys. Rev. Letts.*, vol. 51 (No. 21), pp. 2003–2007, Nov. 1983.
S. Tsuda et al, *Conf. Record*, 18th IEEE Photovoltaic Specialists Conf., (1985), pp. 1295–1300 (published Apr. 28, 1986).
R. R. Arya et al, *Conf. Record*, 18th IEEE Photovoltaic Specialists Conf., (1985), pp. 1710–1711 (published Apr. 28, 1986).
Tiedje et al., Charge Transfer Doping in Amorphous Semiconductor Superlattices, *Applied Physics Letters*, vol. 45, Jul. 5, 1984, pp. 179–181.

Primary Examiner—Aaron Weisstuch
Attorney, Agent, or Firm—Finnegan, Henderson, Farabow, Garrett & Dunner

[57] ABSTRACT

Superlattice doped layers for amorphous silicon photovoltaic cells comprise a plurality of first and second lattices of amorphous silicon alternatingly formed on one another. Each of the first lattices has a first optical bandgap and each of the second lattices has a second optical bandgap different from the first optical bandgap. A method of fabricating the superlattice doped layers also is disclosed.

19 Claims, 6 Drawing Figures

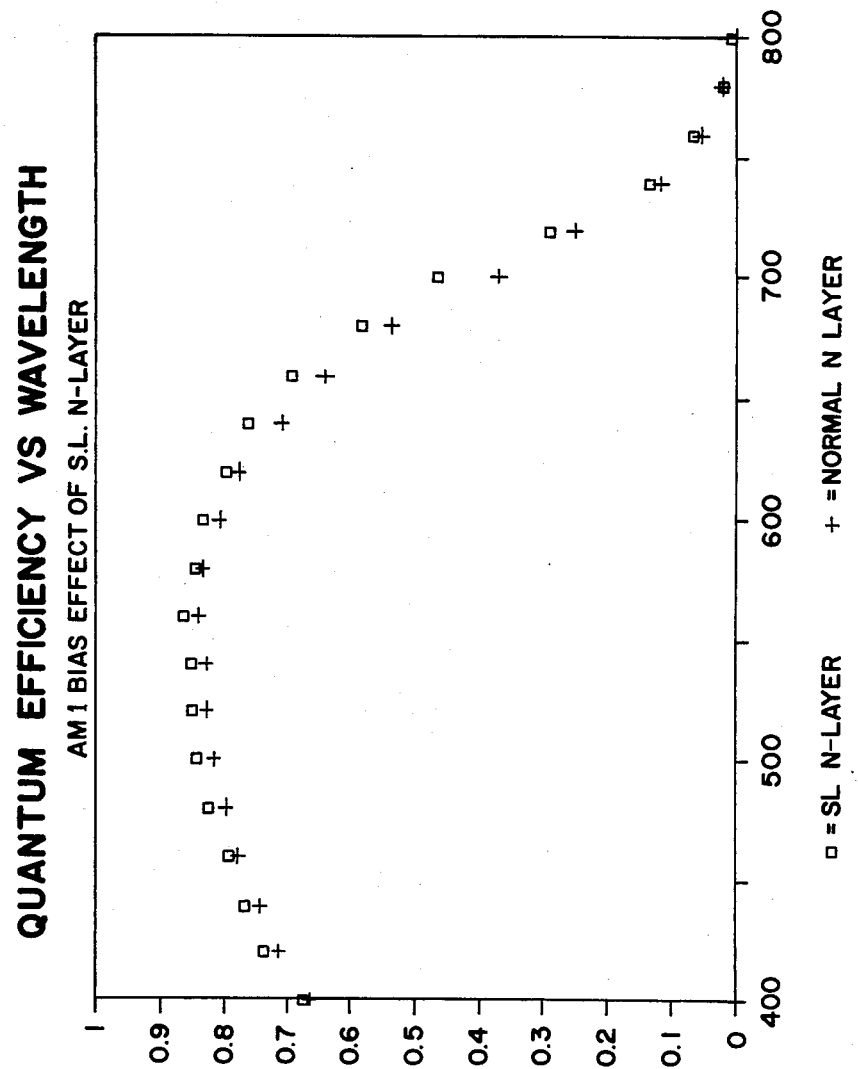

SUPERLATTICE DOPED LAYERS FOR AMORPHOUS SILICON PHOTOVOLTAIC CELLS

BACKGROUND OF THE INVENTION

1. Field of the Invention

The present invention relates to photovoltaic cells containing amorphous silicon. More particularly, the present invention relates to amorphous silicon photovoltaic cells having a p-i-n, n-i-p, or p-n structure in which the p- and/or n- layers are formed from a plurality of sub-layers or lattices having alternatingly high and low optical bandgaps.

2. Description of the Related Art

In an amorphous silicon photovoltaic cell having a p-i-n structure, the p-layer has two primary functions. First, it acts as a window to incoming radiation, that is, it permits light to pass through it into the i-layer where the light is absorbed and generates carriers to produce the photovoltaic effect. Second, it forms a p-i junction with the i-layer to separate the photogenerated carriers.

To optimize its light-transmitting function, the p-layer should have the widest possible optical bandgap to minimize absorption of incoming radiation. For its second function, the p-layer should be sufficiently conducting that it forms a good p-i junction. In addition, the p-layer should be conducting to minimize its contribution to the overall series resistance of the photovoltaic cell.

As is well known in the art, the optical bandgap of amorphous silicon can be increased by incorporating carbon into the amorphous silicon. This can be accomplished, for example, by glow discharge of a gas mixture of silane and methane, which produces a hydrogenated amorphous silicon-carbon alloy, referred to herein as amorphous silicon carbide (a-SiC:H). The p-layer further includes a dopant to provide p-type conductivity. The dopant conventionally is boron introduced as diborane ($B_2H_6$) in the gas mixture forming the p-layer. The dopant concentration and, therefore, the conductivity of an a-SiC:H p-layer largely are functions of the amount of carbon in the p-layer. As the concentration of carbon is increased to provide a wider bandgap, it becomes more difficult to introduce the p-type dopants, which provide the p-layer with its high electrical conductivity. Consequently, a tradeoff normally must be made between the optical bandgap and electrical conductivity characteristics of doped a-SiC:H p-layers. This tradeoff has limited the optical bandgap of conventional p-layers to approximately 2 eV and the efficiency of amorphous silicon photovoltaic cells to approximately 10-11%.

Although the light-transmitting characteristics of the n-layer of a p-i-n structure are less critical than those of the p-layer, it is desirable to limit the amount of light absorbed by the doped n-layer also. A given amount of radiation will pass through both the p-layer and the i-layer without being absorbed. Preferably, this light enters the n-layer and then is reflected back into the i-layer by the back contact formed on the n-layer. To the extent that the material characteristics of the n-layer are not optimized for light-transmitting qualities, light absorption by the n-layer also limits the efficiency of the photovoltaic cell.

The present invention is intended to provide an amorphous silicon photovoltaic cell having a p-layer with a wider effective optical bandgap than conventional p-layers without detracting from the p-layer's conductivity characteristics.

The present invention is also intended to provide a photovoltaic cell made of amorphous silicon having an n-layer of increased transparency to minimize absorption of radiation reflected back into the adjacent layer through the n-layer without decreasing the conductivity of the n-layer.

Additional advantages of the present invention will be set forth in part in the description that follows and in part will be obvious from that description or can be learned by practice of the invention. The advantages of the invention can be realized and obtained by the structure and method particularly pointed out in the appended claims.

SUMMARY OF THE INVENTION

The present invention overcomes the problems of the prior art photovoltaic cells by providing doped layers having a superlattice construction including two or more types of lattices having different optical bandgaps alternatingly formed on one another.

To overcome the problems of the prior art photovoltaic cells and in accordance with the purpose of the invention, as embodied and broadly described herein, the superlattice doped layer of this invention for a photovoltaic cell comprises a plurality of first and second lattices of amorphous silicon alternatingly formed on one another, each of the first lattices having a first optical bandgap and each of the second lattices having a second optical bandgap different from the first optical bandgap.

This invention further includes a photovoltaic cell comprising a transparent superstrate; a layer of transparent conductive oxide formed on the superstrate; a superlattice p-layer of amorphous silicon formed on the conductive oxide layer, the p-layer including a plurality of first and second lattices alternatingly formed on one another, each of the first lattices having a first optical bandgap and each of the second lattices having a second optical bandgap different from the first optical bandgap; an i-layer of amorphous silicon formed on the p-layer; an n-layer of amorphous silicon formed on the i-layer; and a back contact layer of conductive material formed on the n-layer.

Preferably, the superlattice p-layer has a total thickness of approximately 100–150 Å and includes 6–10 lattices, each having a thickness of approximately 12–30 Å. The first optical bandgap preferably is greater than or equal to about 2.25 eV and the second optical bandgap preferably is about 1.7–2.0 eV. More preferably, the p-layer comprises 4 first lattices and 4 second lattices.

Broadly, the present invention further includes a superlattice n-layer for a p-i-n photovoltaic cell comprising a plurality of third and fourth lattices of amorphous silicon alternatingly formed on one another, each of the third lattices having a third optical bandgap and each of the fourth lattices having a fourth optical bandgap different from the third optical bandgap. Preferably, the n-layer has a total thickness of about 200–500 Å. The third optical bandgap preferably is about 1.9–2.1 eV, and the fourth optical bandgap preferably is about 1.7–1.9 eV. The thickness of each lattice preferably is about 10–40 Å, and the total number of lattices preferably is 8–20.

Broadly, this invention further includes a method for forming superlattice p- and n- layers.

The accompanying drawings, which are incorporated in and which constitute a part of this specification, illustrate various embodiments of the invention and, together with the description, explain the principles of the invention.

BRIEF DESCRIPTION OF THE DRAWINGS

FIG. 6 is a graph showing the relationship between quantum efficiency and wavelength for a photovoltaic cell having a superlattice p-layer and a conventional n-layer and for a photovoltaic cell having a superlattice p-layer and a superlattice n-layer.

DESCRIPTION OF THE PREFERRED EMBODIMENTS

Reference now will be made in detail to presently preferred embodiments of the invention, examples of which are illustrated in the accompanying drawings.

Figure 1:
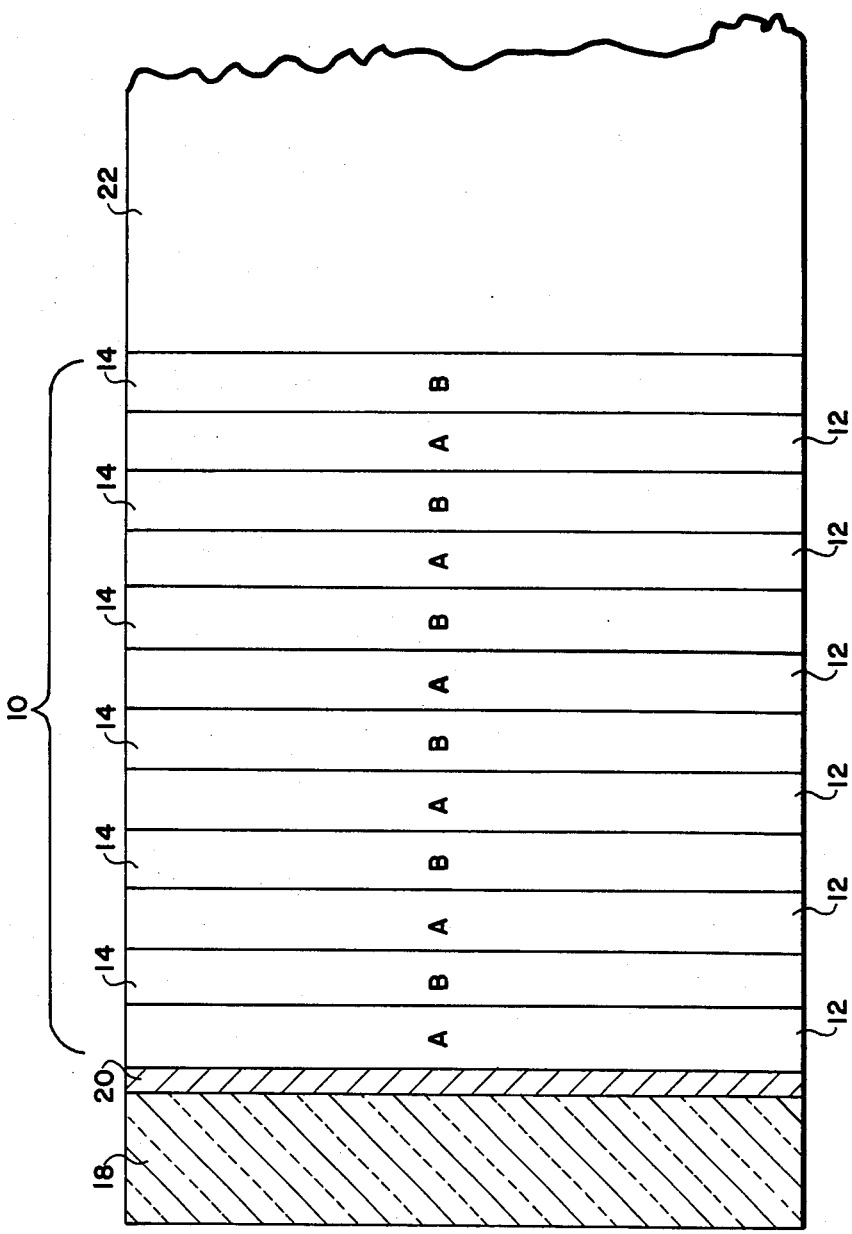
FIG. 1 is a schematic cross sectional view of a superlattice doped layer for an amorphous silicon photovoltaic cell.

FIG. 1 is a schematic cross sectional view of the superlattice p-layer of the present invention. The p-layer, designated generally by reference numeral 10, comprises a plurality of first lattices 12 and a plurality of second lattices 14 of amorphous silicon alternatingly formed on one another. When first lattices 12 are designated as A lattices and second lattices 14 are designated as B lattices, the resulting p-layer has a structure of ABABABAB . . . .

Each of the A lattices has a predetermined first optical bandgap, and each of the B lattices has a predetermined second optical bandgap different from the first optical bandgap. The bandgap values are determined by the amount of carbon that is present in the lattice. Preferably, the A lattice has a wider bandgap than the B lattice. The A lattices preferably have a bandgap greater than about 2.25 eV and, more preferably, greater than about 2.4 eV. The B lattices preferably have a bandgap of approximately 1.7-2.0 eV and, more preferably, about 2 eV.

Figure 2:
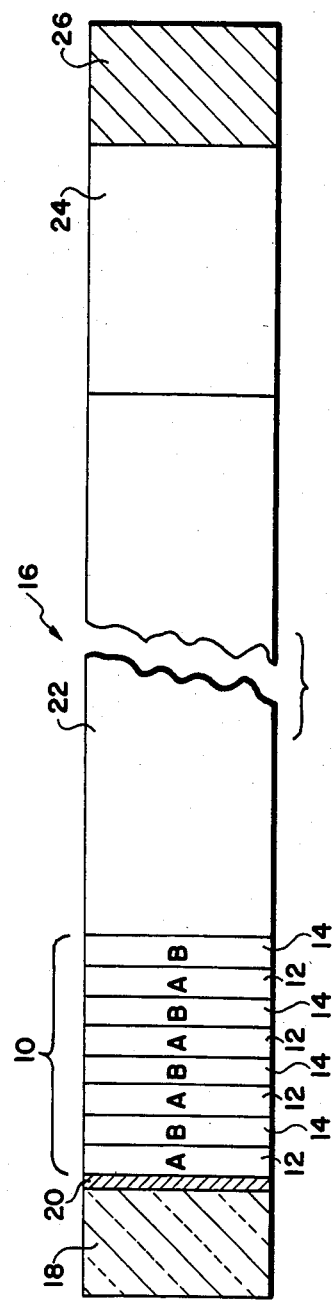
FIG. 2 is a schematic cross sectional view of a p-i-n amorphous silicon photovoltaic cell having a superlattice p-layer.

FIG. 2 shows a p-i-n photovoltaic cell 16 comprising a transparent superstrate 18 (also see FIG. 1) made of glass or plastic and coated with a layer 20 (also see FIG. 1) of transparent conductive oxide, preferably tin oxide. The superlattice p-layer 10 described above is formed on conductive oxide layer 20, and an intrinsic layer 22 (i-layer) of amorphous silicon is formed on p-layer 10. In FIG. 2, an n-layer 24 is formed on i-layer 22 and a metal back contact layer 26 is formed on n-layer 24.

Except for the superlattice p-layer, the photovoltaic cell of FIG. 2 has a conventional structure. (See, e.g., the cells shown in U.S. Pat. No. 4,064,521, which is hereby incorporated herein by reference.) Preferably, the conductive oxide layer is approximately 5000 Å thick, the intrinsic layer is approximately 5000-6000 Å thick, and the n-layer is approximately 200-500 Å thick.

Figure 3:
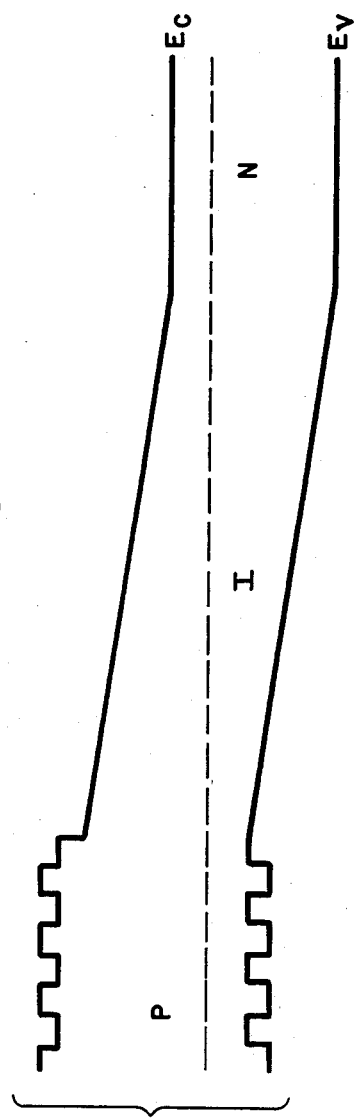
FIG. 3 is an idealized bandgap diagram for the photovoltaic cell of FIG. 2.

FIG. 3 is an idealized band diagram showing how the bandgap varies over the thickness of the cell of FIG. 2. The dashed line indicates the Fermi level. The solid line labelled $E_v$ is the valence band, and the solid line labelled $E_c$ is the conduction band.

The contradictory functions of the p-layer place practical restrictions on the overall thickness of the superlattice p-layer of this invention. The thickness of the p-layer should be below a predetermined maximum to minimize the optical absorption losses attributable to the carbon content and the dopants in the p-layer. Conversely, the p-layer must have a predetermined minimum thickness to enable it to sustain the space-charge region. The preferred minimum thickness of the p-layer will depend on its conductivity; the higher the conductivity the thinner the p-layer can be made. I have found that a total p-layer thickness of about 100-150 Å is preferred for striking a proper balance between the light-transmitting and carrier conducting functions of the p-layer.

Preferably and as shown in FIG. 2, the superlattice p-layer of this invention comprises eight lattices, four A lattices and four B lattices. I have found that an eight-lattice p-layer provides optimum results, although photovoltaic cells with p-layers having 6-10 lattices produce acceptable results. The thickness of each individual lattice preferably is about 12-30 Å.

I have found that multi-layered p-layers having less than four lattices generally perform no better than conventional single-lattice p-layers. Indeed, photovoltaic cells having p-layers comprised of two to four lattices in the ABAB . . . configuration can have efficiencies less than or equal to cells with single-lattice p-layers. Unless the overall thickness of the p-layer of four or fewer lattices is dramatically reduced, each individual A lattice of wider optical bandgap and lower conductivity creates a relatively thick barrier layer of high resistance that impedes the movement of carriers through the p-layer and increases the overall series resistance of the cell.

Furthermore, I have found that p-layers comprised of more than ten lattices and having an overall thickness of 100-150 Å typically are difficult to form by conventional methods. The individual lattices of a p-layer having twelve or more lattices are too thin to be formed with a reasonable degree of control. Typical deposition methods deposit approximately 6 Å per second. Under such typical deposition conditions, it is difficult to deposit a discrete layer of material thinner than approximately 12 Å. If improved deposition methods permit controlled formation of superlattice p-layers having twelve or more lattices and an overall thickness of 100-150 Å, however, such p-layers would provide the same or a greater advantage as six- to ten-lattice p-layers.

A method of forming a p-i-n photovoltaic cell having the superlattice p-layer of the present invention now will be described with reference to FIG. 2.

First, conductive oxide layer 20 is fabricated on one side of transparent superstrate 18 by conventional deposition methods. Preferably, the conductive oxide layer comprises conductive tin oxide (CTO). Alternatively, a superstrate having a preformed CTO layer can be used.

The CTO-coated substrate then is placed in a deposition chamber capable of depositing layers of amorphous silicon alloys on the CTO side of the superstrate. (See, e.g., U.S. Pat. No. 4,064,521.) DC glow discharge is the preferable method of forming the superlattice p-layer, the i-layer, and the n-layer of the photovoltaic cell shown in FIG. 2. Other methods such as RF glow discharge, photo-CVD, CVD, sputtering, evaporation, or any other appropriate thin-film deposition method also can be used. The substrate temperature preferably is controlled at 150°–300° C. during deposition of the A and B lattices, the i-layer, and the n-layer.

A lattices 12 and B lattices 14 of superlattice p-layer 10 are formed by depositing material from two distinct gaseous mixtures. Preferably, both the A lattices and the B lattices contain p type dopants, the B lattices having a higher or equal dopant concentration (and lower carbon concentration) to provide a lattice having a lower bandgap and higher conductivity than the A lattices. Preferably, the doping element utilized in the p-layer is boron, which is introduced into the deposition gas in the form of diborane ($B_2H_6$). The deposition gases preferably comprise mixtures of silane ($SiH_4$) containing 1–2% (molar) diborane, pure silane, and methane ($CH_4$). The dopant concentration of the individual lattices preferably is determined by the relative percentage of pure silane and methane in the deposition gas mixture. The amount of carbon deposited from the methane determines the percentage of boron atoms that act as dopants in the resulting amorphous silicon carbide lattice.

Preferably, the p-layer has an overall thickness of 100–150 Å and each lattice is 12–30 Å thick. The individual lattices can be of approximately equal thickness or the lattice thickness may be varied. The deposition chamber preferably is flushed for 30–90 seconds after the formation of each lattice with the gas mixture to be used to form the subsequent lattice.

After the eight A and B lattices of p-layer 10 are formed, the deposition chamber is flushed with pure silane for 10–20 minutes and i-layer 22 is deposited by glow discharge of pure silane. The i-layer preferably is 5000–6000 Å thick.

After the i-layer is deposited, the deposition chamber is flushed for approximately 120 seconds with the gas mixture that is to be used to form n-layer 24. Preferably, the n-type dopant in the n-layer is phosphorous, and a mixture of silane containing phosphine ($PH_3$) and pure silane is used to deposit an n-layer 24 of approximately 400 Å thickness. After deposition of the n-layer, a metal back contact 26 is formed by conventional methods on the n-layer to complete the photovoltaic cell.

By sandwiching the smaller-bandgap B lattices between larger-bandgap A lattices, a "quantum well" effect can be produced in the p-layer so that a larger effective optical bandgap for the overall p-layer results. The quantum well effect is well established in crystalline semiconductors. Because a crystalline semiconductor has a periodic structure, the motion of carriers is effected by the "potential well" created by the lattice. When the size of the potential well is of the order of the carrier DeBroglie wavelength, the quantum well effect manifests itself. The wave functions associated with the free electrons and holes are confined to a one-dimensional well. This pushes the first extended states and, therefore, the band edges of the semiconductor to higher energies leading to an "effective" optical bandgap that lies between the bandgaps of the wider and narrower bandgap layers.

A similar but more limited phenomenon occurs with superlattice amorphous semiconductor layers. In the absence of a crystalline structure, the carriers of amorphous semiconductors are more localized and the effective mass of carriers is greater. As a result, the wave functions associated with the carriers are less extended than with crystalline semiconductors, and the quantum well effect operates over shorter distances than in crystalline structures. For example, whereas in crystalline GaAs/GaAlAs systems the quantum well effect appears over distances of the order of 200 Å, in amorphous semiconductor systems one would expect the quantum well effect to appear over distances of less than 50 Å.

Furthermore, if the thicknesses of the individual lattices are optimized, one can produce "transfer doping," in which carriers (holes) are transferred from the wider-bandgap lattices to the narrower-bandgap lattices, thereby increasing the overall conductivity of the p-layer. In transfer doping, electrical conductivity is enhanced by transfer of charges between the lattices rather than by the presence of external dopants. In an n-type superlattice structure having, for example, narrow bandgap layers of amorphous silicon (a-Si:H) and wider bandgap lattices of amorphous silicon nitride (a-SiN:H), the gap states in the amorphous silicon nitride lattice or the gap states at the interface between the lattices donate electrons to the amorphous silicon lattice and fix the Fermi level close to the conduction band edge of amorphous silicon. A similar effect takes place in superlattice p-layers formed of amorphous silicon carbide of different bandgaps. In the p-layer, of course, a transfer of holes takes place from the wider bandgap material to the narrower bandgap material.

The superlattice p-layer configuration provides an additional benefit in confining the dopants to the p-layer more effectively than is possible with conventional single-lattice p-layers. Contamination of the i-layer with dopants is a problem that has been encountered with conventional p-i-n photovoltaic cells.

P-i-n amorphous silicon photovoltaic cells fabricated with superlattice p-layers in accordance with this invention have shown substantial improvements over conventional cells having the same overall layer thickness and dopant concentration. When compared with conventional p-i-n cells, the superlattice p-layer cells of this invention generally provide an increase in open-circuit voltage of approximately 6–10%, an increase in short-circuit current of approximately 2–6%, and an increase in conversion efficiency of approximately 10–20%.

Figure 4:
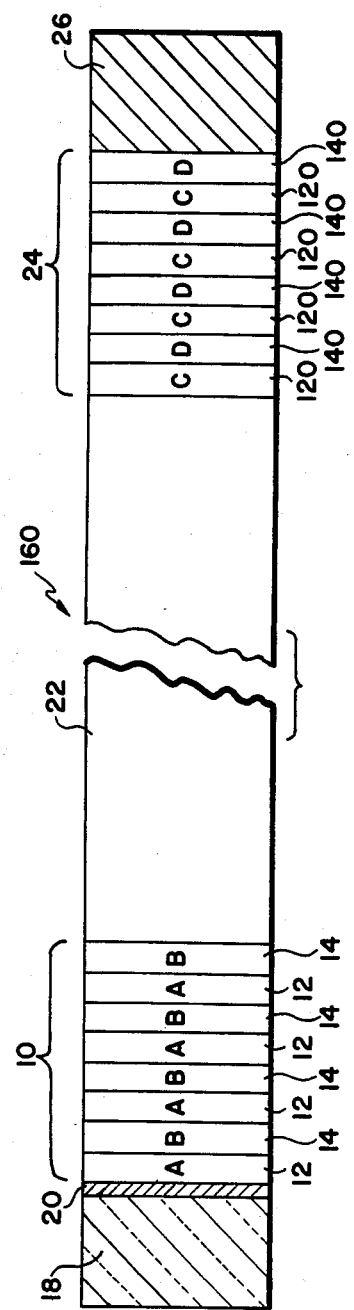
FIG. 4 is a schematic cross sectional view of a p-i-n amorphous silicon photovoltaic cell having a superlattice p-layer and a superlattice n-layer.

Further improvements in performance can be achieved when both the p-layer and n-layer of a p-i-n photovoltaic cell have a superlattice structure. Such a cell, termed a SLp-i-SLn photovoltaic cell, is shown in FIG. 4. The cell of FIG. 4, designated generally by reference numeral 160, has essentially the same structure as the cell of FIG. 2, except that n-layer 24 comprises a plurality of third lattices 120 and a plurality of fourth lattices 140 of amorphous silicon alternatingly formed on one another. When third lattices 120 are designated as C lattices and fourth lattices 140 are designated as D lattices, the resulting n-layer has a structure of CDCDCDCD . . . . The C and D lattices preferably are deposited in DC glow discharge, although other methods such as RF glow discharge, photo-CVD, CVD, sputtering, evaporation, or any other conventional thin-film deposition method also can be used.

Figure 5:
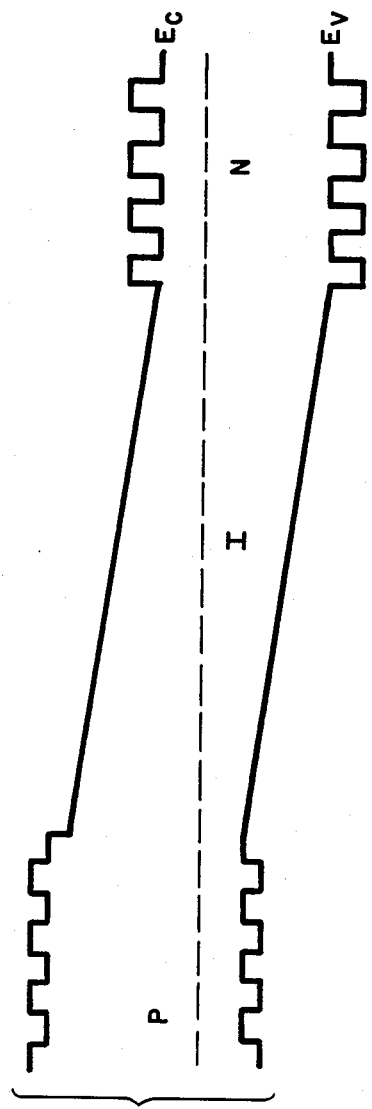
FIG. 5 is an idealized bandgap diagram for the photovoltaic cell of FIG. 4.

Each of the C lattices has a predetermined third optical bandgap, and each of the D lattices has a predetermined fourth optical bandgap different from the third optical bandgap. The bandgap values are determined by the amount of carbon present in the lattice. Preferably, the C lattice has a wider bandgap than the D lattice. The C lattice preferably has an optical bandgap of about 1.9–2.1 eV, and the D lattice preferably has an optical bandgap of approximately 1.7–1.9 eV. FIG. 5 is an idealized band diagram for the cell of FIG. 4.

A photovoltaic cell having a superlattice n-layer exhibits a higher quantum efficiency than an identical cell having a homogeneous n-layer when subjected to light having wavelengths ranging from approximately 560 nm (green) to 700 nm (red ). The wider-bandgap lattices of the superlattice n-layer permit more light to be reflected back into the i layer by the back electrodes.

The C lattices preferably are deposited from a gaseous mixture of silane, methane, and silane containing about 4–5% (molar) phosphine ($PH_3$). The phosphorous acts as the n-type dopant. The D lattices preferably contain no carbon and are deposited from a gaseous mixture of silane and phosphine. The total thickness of the superlattice n-layer preferably is about 200–500 Å. The thicknesses of the individual lattices preferably is 10–40 Å, and the total number of lattices preferably is 8–20.

Photovoltaic cells having an n-i-p structure, in which the n-layer is the light-incident layer, also can be formed with a superlattice n-layer and with either a conventional homogeneous p-layer or a superlattice p-layer. Furthermore, a superlattice p-layer or superlattice n-layer of amorphous silicon can be used as the window layer for a variety of heterojunction p-n cells, in which a superlattice p-type or n-type doped layer of amorphous silicon is formed on a photovoltaically active region of a conductivity type opposite that of the superlattice amorphous silicon doped layer. The photovoltaically active region can be formed of crystalline silicon, polycrystalline silicon, or any other photovoltaically active material in any conventionally known manner.

The invention is illustrated further by the following examples.

EXAMPLE I

A test was performed to determine the optical bandgaps and resistivities of superlattice p-layers relative to conventional homogeneous p-layers. Because such properties are difficult to determine for a p-layer having a thickness equal to that actually used in a photovoltaic cell, p-layers having a total thickness of 2000–3000 Å were deposited on quartz substrates for optical bandgap measurements. To determine in-plane resistivity, the same films were deposited on quartz substrates having pre-deposited nichrome pads.

Six separate homogenous p-layers were fabricated by DC glow discharge of gaseous mixtures of silane, silane containing diborane, and methane. The bandgaps of the homogeneous p-layers were varied by controlling the concentration of methane in the deposition gas mixture. Three superlattice p-layers having an ABABAB . . . structure also were fabricated by DC glow discharge of gaseous mixtures of silane, silane containing diborane, and methane. The A-layers were deposited from a mixture having a 60% methane concentration, and the B-layers were deposited from a gaseous mixture having a 40% methane concentration. Each superlattice p-layer included approximately 90–120 lattices. The three superlattice p-layers had A lattices approximately 12 Å, 18 Å, and 24 Å thick, respectively. The B lattices were approximately 24 Å thick for all three superlattice p-layers. The temperature of the substrates was maintained at approximately 240° C. for both the homogeneous and superlattice structures.

The optical bandgaps were calculated from optical transmission and reflection measurements made with a spectrophotometer. Resistivity measurements were made with a standard four-point probe arrangement, and the activation energies were calculated from the temperature dependence of dark resistivity. For each sample, the methane concentration (%$CH_4$), the optical bandgap (Eg), the in-plane dark resistivity ($\rho_d$), and the activation energy (Ea) were determined. The results are set forth in Table I.

TABLE I

| Sample No. | % $CH_4$ | Eg (eV) | $\rho d$ (ohm-cm) | Ea (eV) | P-Layer Construction |
|---|---|---|---|---|---|
| 1 | 0 | 1.70 | $2.0 \times 10^5$ | 0.50 | Homogeneous |
| 2 | 20 | 1.78 | $1.6 \times 10^5$ | 0.45 | Homogeneous |
| 3 | 30 | 1.82 | $2.0 \times 10^6$ | 0.46 | Homogeneous |
| 4 | 40 | 1.95 | $2.0 \times 10^7$ | 0.57 | Homogeneous |
| 5 | 50 | 2.07 | $7.9 \times 10^8$ | 0.74 | Homogeneous |
| 6 | 60 | 2.25 | — | — | Homogeneous |
| 7 | 60,40 | 2.10 | $3.6 \times 10^6$ | 0.45 | SL(A = 12Å, B = 24Å) |
| 8 | 60,40 | 2.15 | $2.0 \times 10^6$ | 0.35 | SL(A = 18Å, B = 24Å) |
| 9 | 60,40 | 2.22 | $1.3 \times 10^6$ | 0.48 | SL(A = 24Å, B = 24Å) |

As the methane concentration in the deposition gas was increased from 0% to 60%, the homogenous amorphous silicon carbide p-layers exhibited an increase in optical bandgap from 1.70 eV to 2.25 eV, an increase in dark resistivity of $2 \times 10^5$ ohm-cm to $7.9 \times 10^8$ ohm-cm, and an increase in activation energy of 0.5 eV to 0.74 eV.

The superlattice p-layers included A lattices deposited from a gaseous mixture having a 60% methane concentration (Eg=2.25 eV) and B layers deposited from a gaseous mixture having a 40% methane concentration (Eg=1.95 eV). For a fixed B-lattice thickness of 24 Å, as the thickness of the A lattice was increased from 12 Å to 24 Å, the optical bandgap increased from 2.10 to 2.22 eV, the dark resistivity decreased from $3.6 \times 10^6$ ohm-cm to $1.3 \times 10^6$ ohm-cm, and the activation energy varied between 0.48 and 0.35 eV.

The dark resistivities for the superlattice p-layers were equal to or less than that of the homogeneous p-layer having a bandgap of 1.95 eV (Sample No. 4). At the same time, the superlattice p-layers exhibited optical bandgaps significantly higher than 1.95 eV. Indeed, the superlattice p-layer having 24 Å-thick A and B lattices (Sample No. 9) had an optical bandgap approximately equal to that of the homogeneous p-layer deposited from a gas mixture having a 60% methane concentration (Sample No. 6) while exhibiting a dark resistivity lower than that of the homogeneous p-layer deposited from a gas mixture having only a 30% methane concentration (Sample No. 3). The decrease in dark resistivity also is manifested in lower activation energies for the superlattice p-layers relative to the homogeneous p-layer having a bandgap of 1.95 eV. I believe the wide optical bandgaps of the superlattice p-layers can be attributed to the quantization of the extended states in the narrower bandgap B lattices. The low resistivities might be due to transfer doping of the p-layer by the transfer of holes from the A lattice to the B lattice.

EXAMPLE II

A second test was performed to determine the optical bandgap and conductivity of superlattice n-layers relative to separate homogeneous n-layers. As with the p-layers of Example I, the n-layers were approximately 2000–3000 Å thick and were deposited on plane quartz substrates and quartz substrates having pre-deposited nichrome pads.

The n-layers were deposited by DC glow discharge of gaseous mixtures of silane, silane containing phosphine, and methane at a substrate temperature of about 240° C. The methane concentration of the homogeneous n-layers was varied from 0% to 40%, the methane concentration of the C lattices of the superlattice n-layers was varied from 20% to 40%, and the methane concentration of the D lattices was maintained at 0%. The thickness of the D lattices was varied from 18 Å to 30 Å, and the thickness of the D lattices was fixed at 22 Å. The superlattice n-layers comprised 90–120 lattices. The optical bandgaps, dark resistivities, and activation energies were measured in the same manner as in Example I.

The test results for the n-layers are set forth in Table II. As the methane concentration was increased from 0% to 40%, the optical bandgap of the homogeneous amorphous silicon carbide n-layers increased from 1.79 eV to 2.15 eV, the in-plane dark resistivity increased from $4.3 \times 10^2$ ohm-cm to $1.7 \times 10^6$ ohm-cm. The activation energy also increased with increasing methane concentration, although the activation energy for the 2.15 eV bandgap layer (Sample No. 4) was less than that for the 2.07 eV bandgap p-layer (Sample No. 3). Sample Nos. 7, 8, and 9 each had A lattices deposited from a gas mixture having a 40% methane concentration. These three superlattice n-layers provided a substantial increase in optical bandgap relative to the homogeneous amorphous silicon n-layer (Sample No. 1) without exhibiting the substantial increase in resistivity accompanying the homogeneous amorphous silicon carbide n-layer having a 40% methane concentration.

TABLE II

| Sample No. | % CH$_4$ | Eg (eV) | ρd (ohm-cm) | Ea (eV) | N-Layer Construction |
|---|---|---|---|---|---|
| 1 | 0 | 1.79 | $4.3 \times 10^2$ | 0.24 | Homogeneous |
| 2 | 20 | 2.01 | $3.7 \times 10^4$ | 0.38 | Homogeneous |
| 3 | 30 | 2.07 | $1.1 \times 10^6$ | 0.45 | Homogeneous |
| 4 | 40 | 2.15 | $1.7 \times 10^6$ | 0.42 | Homogeneous |
| 5 | 20,0 | 1.86 | $6.2 \times 10^4$ | 0.47 | SL(C = 30Å, D = 22Å) |
| 6 | 30,0 | 2.00 | $1.5 \times 10^5$ | 0.39 | SL(C = 30Å, D = 22Å) |
| 7 | 40,0 | 2.03 | $5.8 \times 10^4$ | 0.37 | SL(C = 30Å, D = 22Å) |
| 8 | 40,0 | 2.01 | $5.5 \times 10^4$ | 0.38 | SL(C = 24Å, D = 22Å) |
| 9 | 40,0 | 2.00 | $2.7 \times 10^5$ | 0.41 | SL(C = 18Å, D = 22Å) |

Although the optical and electrical properties of the homogeneous n-layer deposited from a gas having a 20% methane concentration (Sample No. 2) were similar to or better than those of the superlattice n-layers, a superlattice n-layer has a distinct advantage over a homogeneous n-layer having an optical bandgap of about 2 eV when used in a p-i-n photovoltaic cell. With the superlattice structure, carriers from the i-layer can tunnel through the wide-bandgap C lattices into the D lattices because of the small thickness of the C lattices. In contrast, a thick homogeneous n-layer formed of wide-bandgap material presents a barrier at the i-n interface that is difficult for the carriers to overcome because they cannot tunnel through the thick wide-bandgap layer. This barrier at the i-n interface would substantially lower the fill factor of the photovoltaic cell.

EXAMPLE III

Test specimens of p-i-n photovoltaic cells such as that shown in FIG. 2 were fabricated on glass superstrates coated with conductive tin oxide. The superlattice p-layers, the i-layers and the n-layers were deposited by DC glow discharge of prescribed gaseous mixtures at a substrate temperature of approximately 262° C.

The p-layer consisted of eight lattices, designated $A_1$, $B_2$, $A_3$, $B_4$, $A_5$, $B_6$, $A_7$, and $B_8$, deposited in succession. The A lattices were deposited from a gaseous mixture of 12 parts silane containing 1.5% (molar) diborane, 33 parts pure silane, and 55 parts methane. The B lattices were deposited from a gaseous mixture of 12 parts silane containg 1.5% (molar) diborane, 38 parts pure silane, and 50 parts methane. Each of the layers $A_1$, $B_2$, $A_3$, and $B_4$ was approximately 24 Å thick, and each of layers $A_5$, $B_6$, $A_7$, and $B_8$ was approximately 12 Å thick. After the deposition of each lattice, the system was flushed for approximately 60 seconds with the gas mixture to be used for the subsequent lattice. For example, after the $A_1$ lattice was deposited, the system was flushed with the B-lattice mixture for 60 seconds and then the B2 lattice was deposited.

After the p-layer was deposited, the system was flushed with pure silane for approximately 15 minutes and then the i-layer was deposited by DC glow discharge of pure silane. The i-layer thickness was approximately 5800 Å.

After the i-layer was deposited, the system was flushed for approximately 120 seconds with a gaseous mixture of 63 parts silane containing 4.5% (molar) phosphine, 69 parts pure silane, and 10 parts methane. After the system was flushed, the n-layer was deposited by DC glow discharge of the above phosphine-containing gaseous mixture. The n-layer was approximately 400 Å thick. A back contact of aluminum then was deposited on the n-layer by sputtering.

Conventional photovoltaic cells then were fabricated under the same conditions as the above-described superlattice p-layer cells, except that the conventional p-layer comprised a single lattice approximately 144 Å thick deposited by DC glow discharge of a gaseous mixture of 12 parts silane containing 1.5% (molar) diborane, 38 parts pure silane, and 50 parts methane. Thus, the superlattice p-layer and the single-lattice p-layer contained equivalent overall dopant concentrations.

The two sets of cells then were tested on a standard light test table under simulated AM 1.5 global conditions. The open circuit voltage ($V_{oc}$), short circuit current ($J_{sc}$), fill factor (FF), and conversion efficiency (Eff.) were measured. Table III sets forth the results of the tests.

TABLE III

| Sample No. | $V_{oc}$ (mV) | $J_{sc}$ (mA/cm$^2$) | FF | EFF. (%) | P-Layer Type |
|---|---|---|---|---|---|
| SL60C-1-S1 | 887 | 16.64 | .704 | 10.38 | Superlattice |
| SL60C-1-M1 | 874 | 17.14 | .692 | 10.36 | Superlattice |
| SL60C-1-S4 | 887 | 16.84 | .688 | 10.27 | Superlattice |
| SL60C-1-S3 | 880 | 16.25 | .707 | 10.11 | Superlattice |
| SL60C-1-W1 | 879 | 16.76 | .692 | 10.19 | Superlattice |
| SL60D-1-W1 | 882 | 17.06 | .659 | 9.91 | Superlattice |
| SL54-S1 | 820 | 16.17 | .651 | 8.64 | Conventional |

As seen in Table III, the cells with superlattice p-layers have improved open circuit voltages, short circuit currents, and conversion efficiencies when compared to a conventional cell. The open circuit voltage improved by 54–67 mV (6.6–8.2%), the short circuit current improved by 0.08–0.97 mA/cm$^2$ (0.5–6.0%), and the conversion efficiency improved by 1.27–1.74%

(14.7–20.1%). Furthermore, the fill factor also improved.

EXAMPLE IV

In order to understand the origin of the higher open-circuit voltages in terms of a discernable parameter, a second group of conventional and superlattice p-layer p-i-n photovoltaic cells were fabricated in the same manner as in Example III. In addition to measuring the open-circuit voltage and short circuit current, the reverse saturation current density ($J_o$) and the diode quality factor (A) were determined.

The results of the test are set forth in Table IV. The reverse saturation current density is approximately the same for the superlattice p layer cells and the homogeneous p-layer cells. The major difference lies in the diode quality factor. For the homogeneous p-layer cells, the value of a varied from 1.6 to 1.7. For the superlattice p-layer cells, however, the value of a varied from 1.74 to 1.93. This increase in the diode quality factor might account for the higher open-circuit voltages seen in the superlattice p-layer devices.

TABLE IV

| Sample No. | $V_{oc}$ (mV) | $J_{sc}$ (mA/cm$^2$) | $J_o$ (A/cm$^2$) | Diode Factor A | P-Layer Type |
|---|---|---|---|---|---|
| SL24 | 823 | 15.3 | $2.1 \times 10^{-11}$ | 1.68 | Conventional |
| SL28 | 823 | 15.3 | $2.6 \times 10^{-11}$ | 1.69 | Conventional |
| SL22 | 849 | 15.3 | $2.1 \times 10^{-11}$ | 1.78 | Superlattice |
| SL25 | 842 | 15.5 | $2.5 \times 10^{-11}$ | 1.84 | Superlattice |
| SL26 | 847 | 16.1 | $6.6 \times 10^{-11}$ | 1.93 | Superlattice |
| SL27 | 845 | 15.8 | $2.0 \times 10^{-11}$ | 1.78 | Superlattice |
| SL30 | 860 | 16.6 | $2.2 \times 10^{-11}$ | 1.74 | Superlattice |

EXAMPLE V

A conventional p-i-n photovoltaic cell and a p-i-n photovoltaic cell with a superlattice p-layer (SLp-i-n cell) identical to the cells discussed in Example III above were prepared. In addition, a SLp-i-SLn photovoltaic cell was prepared. The latter cell was identical to the SLp-i-n cell except for the configuration of the n-layer, which was of a superlattice construction.

The superlattice n-layer comprised eight C lattices and eight D lattices in a CDCDCD . . . structure. The C layers consisted of amorphous silicon carbide deposited by DC glow discharge of a gaseous mixture of 63 parts silane containing 4.5% (molar) phosphine, 39 parts pure silane, and 40 parts methane. The D lattices were deposited from a gaseous mixture of 63 parts silane containing 4.5% (molar) phosphine and 79 parts pure silane. Each of the C lattices was approximately 30 Å thick, and each of the D lattices was approximately 24 Å thick.

The quantum efficiencies of the SLp-i-n cell and the SLp-i-SLn cell were measured as a function of wavelength and are plotted on the graph shown in FIG. 6. Quantum efficiency is a measure of the proportion of photons entering the cell that are converted into electrical carriers and collected. As seen in FIG. 6, the quantum efficiency of the cell with the superlattice n-layer is higher in the 560–750 nm wavelength range than for the cell having a single homogeneous n-layer and is significantly higher in the 680–720 nm range.

In addition, the collection length and flat-band voltage for the three cells were measured at wavelengths of 400 nm, 560 nm, and 700 nm. Collection length is the ratio of the distance (lc) travelled by a carrier before it recombines to the thickness (L) of the i-layer. The flat-band voltage is the voltage at which the photogenerated current is zero. As seen in Table V, the cell having the superlattice n-layer had longer collection lengths at 560 nm and 700 nm and had a higher flat-band voltage at all three wavelengths.

TABLE V

| Sample No. | Structure | Collection Length (lc/L) | | | Flat-Band Voltage (Volt) | | |
|---|---|---|---|---|---|---|---|
| | | 400 | 560 | 700 (nm) | 400 | 560 | 700 |
| SLP-2 | SLp-i-SLn | 35 | 21 | 12 | 1.08 | 1.00 | 0.93 |
| SLP1-B | SLp-i-n | 42 | 13 | 8 | 1.04 | 0.97 | 0.89 |
| SLP-5 | p-i-n | 24 | 16 | 10 | 1.00 | 0.94 | 0.85 |

From the preceding Examples and Tables, it can be seen that the superlattice p-layer of this invention can provide a wider overall optical bandgap and enhanced conductivity when compared to a conventional homogeneous p-layer, thus reducing the compromises which must be made between the radiation transmitting and conductivity-enhancing functions of the p-layer. The superlattice p layer of the present invention, when included in a p-i-n photovoltaic cell, provides significant increases in the open circuit voltage, short circuit current, and conversion efficiency when compared to equally dimensioned and doped conventional homogeneous p-layer cells.

Furthermore, a superlattice n-layer increases the quantum efficiency of a photovoltaic cell over a wide range of wavelengths because its wide-bandgap lattices permit more light to be reflected back into the i-layer than with conventional homogeneous n-layers.

It will be apparent to those skilled in the art that modifications and variations can be made in the superlattice photovoltaic cells of this invention without departing from the scope of the invention. For example, doped layers having lattices of equal thickness can be formed, and the lattices can be continuously deposited by switching the gaseous mixture instead of flushing the system between the deposition of lattices. Instead of doping both the A and B lattices, dopants can be added to only one of the types of lattices. Both the C and D lattices can be doped with an n-type dopant. Furthermore, the dopant gas composition can vary between individual A, B, C, or D lattices. Dopants other than diborane and phosphine can be used. A superlattice p-layer or n-layer also can be comprised of an odd number of lattices and can be fabricated, respectively, as a BABABA . . . or DCDCDC . . . structure. The invention in its broader aspects is, therefore, not limited to the specific details and illustrated examples shown and described. Accordingly, it is intended that the present invention cover such modifications and variations, provided that they fall within the scope of the appended claims and their equivalents.

What is claimed is:

1. A photovoltaic cell, comprising:
  a. a transparent superstrate;
  b. a layer of transparent conductive oxide formed on said superstrate;
  c. a superlattice p-layer of amorphous silicon carbide formed on said conductive oxide layer, said p-layer including a plurality of first and second lattices alternatingly formed on one another, each of said first and second lattices having a thickness of approximately 12–30 Å, each of said first lattices having a first optical bandgap greater than or equal to about 2.25 eV, and each said second lattices having a second optical bandgap of about 1.7–2.0 eV.

d. an i-layer of amorphous silicon formed on said p-layer;

e. an n-layer of amorphous silicon formed on said i-layer; and f. a back contact layer of conductive material formed on said n-layer.

2. The photovoltaic all of claim 1, wherein said first optical bandgap is greater than or equal to about 2.4 eV and said second optical bandgap is about 2.0 eV.

3. The photovoltaic cell of claim 1, wherein said p-layer includes 6–10 lattices.

4. The photovoltaic cell of claim 1, wherein said p-layer includes 4 first lattices and 4 second lattices.

5. The photovoltaic cell of claim 1, wherein the total thickness of said p-layer is about 100–150 Å.

6. The photovoltaic cell of claim 1, wherein said first and second lattices both contain a p-type dopant.

7. The photovoltaic cell of claim 6, wherein said p-type dopant includes boron.

8. The photovoltaic cell of claim 1, wherein said first lattice is undoped and said second lattice contains a p-type dopant.

9. The photovoltaic cell of claim 8, wherein said p-type dopant includes boron.

10. A photovoltaic cell, comprising:

a. a transparent superstrate;

b. a layer of transparent conductive oxide formed on said superstrate;

c. a superlattice p-layer of amorphous silicon carbide formed on said conductive oxide layer, said p-layer including a plurality of first and second lattices alternatingly formed on one another, each of said first and second lattices having a thickness of approximately 12–30 Å, each said first lattices having a first optical bandgap, and each said second lattices having a second optical bandgap different from said first optical bandgap;

d. an i-layer of amorphous silicon formed on said p-layer;

e. a superlattice n-layer of amorphous silicon formed on said i-layer, said n-layer including a plurality of third and fourth lattices alternatingly formed on one another, each of said third and fourth lattices having a thickness of approximately 10–40 Å, each of said third lattices having a third optical bandgap of about 1.9–2.1 eV, and each of said fourth lattices having a fourth optical bandgap less than said third optical bandgap and of about 1.7–1.9 eV; and f. a back contact layer of conductive material formed on said n-layer.

11. The photovoltaic cell of claim 10, wherein said third lattice is of amorphous silicon carbide.

12. The photovoltaic cell of claim 11, wherein said fourth lattice is of amorphous silicon carbide having a lower carbon concentration than said third lattice.

13. The photovoltaic cell of claim 10, wherein said n-layer includes 8–20 lattices.

14. The photovoltaic cell of claim 10, wherein said n-layer includes eight third lattices and eight fourth lattices.

15. The photovoltaic cell of claim 10, wherein the total thickness of said n-layer is about 200–500 Å.

16. The photovoltaic cell of claim 10, wherein said third and fourth lattices both contain an n-type dopant.

17. The photovoltaic cell of claim 16, wherein said n-type dopant includes phosphorous.

18. The photovoltaic cell of claim 10, wherein said third lattice contains an n-type dopant and said fourth lattice is undoped.

19. The photovoltaic cell of claim 18, wherein said n-type dopant includes phosphorous.

* * * * *

UNITED STATES PATENT AND TRADEMARK OFFICE
CERTIFICATE OF CORRECTION

PATENT NO. : 4,718,947

DATED : January 12, 1988

INVENTOR(S) : Rajeewa Arya

It is certified that error appears in the above-identified patent and that said Letters Patent is hereby corrected as shown below:

In column 1, in the lines between the title of the invention and "BACKGROUND OF THE INVENTION" insert --The Government of the United States of America has rights in this invention pursuant to Subcontract No. SERI ZB-4-03056-3 awarded by the U.S. Department of Energy.--

Signed and Sealed this

Twentieth Day of April, 1993

*Attest:*

MICHAEL K. KIRK

*Attesting Officer*     *Acting Commissioner of Patents and Trademarks*